(12) United States Patent
Furuta et al.

(10) Patent No.: US 8,999,847 B2
(45) Date of Patent: Apr. 7, 2015

(54) A-SI SEASONING EFFECT TO IMPROVE SIN RUN-TO-RUN UNIFORMITY

(75) Inventors: Gaku Furuta, Sunnyvale, CA (US); Soo Young Choi, Fremont, CA (US); Beom Soo Park, San Jose, CA (US); Young-jin Choi, Santa Clara, CA (US); Omori Kenji, Neyagawa (JP)

(73) Assignee: Applied Materials, Inc., Santa Clara, CA (US)

( * ) Notice: Subject to any disclaimer, the term of this patent is extended or adjusted under 35 U.S.C. 154(b) by 321 days.

(21) Appl. No.: 13/207,315

(22) Filed: Aug. 10, 2011

(65) Prior Publication Data

US 2012/0040536 A1 Feb. 16, 2012

Related U.S. Application Data

(60) Provisional application No. 61/374,158, filed on Aug. 16, 2010.

(51) Int. Cl.
| | |
|---|---|
| H01L 21/311 | (2006.01) |
| H01L 21/02 | (2006.01) |
| C23C 16/34 | (2006.01) |
| C23C 16/44 | (2006.01) |

(52) U.S. Cl.
CPC ........ H01L 21/02274 (2013.01); C23C 16/345 (2013.01); C23C 16/4404 (2013.01); H01L 21/0217 (2013.01)

(58) Field of Classification Search
CPC ............ H01L 21/0217; H01L 21/02274; H01L 21/318; H01L 21/28556; H01L 21/0206; C23C 16/345; C23C 16/4404
USPC ............... 438/758, 778, 791, 643, 694, 703; 257/E21.17, E21.293
See application file for complete search history.

(56) References Cited

U.S. PATENT DOCUMENTS

| | | | |
|---|---|---|---|
| 6,121,161 A | 9/2000 | Rossman et al. | |
| 6,432,255 B1 | 8/2002 | Sun et al. | |
| 6,534,424 B2 | 3/2003 | Fu et al. | |
| 6,559,070 B1 * | 5/2003 | Mandal | 438/781 |
| 7,183,177 B2 | 2/2007 | Al-Bayati et al. | |
| 2003/0143410 A1 | 7/2003 | Won et al. | |
| 2004/0235292 A1 * | 11/2004 | Rajagopalan et al. | 438/637 |
| 2005/0233092 A1 | 10/2005 | Choi et al. | |
| 2006/0093756 A1 | 5/2006 | Rajagopalan et al. | |
| 2006/0228496 A1 * | 10/2006 | Choi et al. | 427/569 |
| 2008/0118663 A1 | 5/2008 | Choi et al. | |
| 2009/0093080 A1 * | 4/2009 | Choi et al. | 438/73 |
| 2009/0197401 A1 | 8/2009 | Li et al. | |
| 2009/0242511 A1 | 10/2009 | Shimazu et al. | |

* cited by examiner

Primary Examiner — Khiem D Nguyen
(74) Attorney, Agent, or Firm — Patterson & Sheridan, LLP

(57) ABSTRACT

Embodiments of the present invention provide methods for depositing a nitrogen-containing material on large-sized substrates disposed in a processing chamber. In one embodiment, a method includes processing a batch of substrates within a processing chamber to deposit a nitrogen-containing material on a substrate from the batch of substrates, and performing a seasoning process at predetermined intervals during processing the batch of substrates to deposit a conductive seasoning layer over a surface of a chamber component disposed in the processing chamber. The chamber component may include a gas distribution plate fabricated from a bare aluminum without anodizing. In one example, the conductive seasoning layer may include amorphous silicon, doped amorphous silicon, doped silicon, doped polysilicon, doped silicon carbide, or the like.

17 Claims, 3 Drawing Sheets

US 8,999,847 B2

A-SI SEASONING EFFECT TO IMPROVE SIN RUN-TO-RUN UNIFORMITY

CROSS-REFERENCE TO RELATED APPLICATIONS

This application claims benefit of U.S. provisional patent application Ser. No. 61/374,158, filed Aug. 16, 2010, which is herein incorporated by reference.

BACKGROUND OF THE INVENTION

1. Field of the Invention

Embodiments of the present invention generally relate to an amorphous silicon (a-Si) seasoning process for silicon nitride film deposited on large-sized substrates in a batch process using a plasma enhanced chemical vapor deposition (PECVD) system.

2. Description of the Related Art

One of the primary steps in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film.

An alternative method of depositing layers over a substrate includes plasma enhanced CVD (PECVD) techniques. Plasma enhanced CVD techniques promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. The relatively low temperature of some PECVD processes helps semiconductor manufacturers lower the overall thermal budget in the fabrication of some integrated circuits.

One type of material that semiconductor manufacturers commonly deposit using PECVD techniques is silicon nitride. Silicon nitride films are used for a variety of different purposes in integrated circuits. For example, a silicon nitride film may be used as an insulating layer around transistor gates or a barrier layer between a premetal dielectric layer and the semiconductor substrate.

With the rapid growth in the large area panels, the ever-increasing substrate sizes create significant manufacturing challenges relative to reliable wafer-to-wafer repeatability and uniformity of deposited material layers. For example, in the conventional batch process for PECVD-deposited SiN films, differences in the rate of dissociation of precursor gases, fluctuations in the chamber pressure (which may occur when reactant species are introduced into the chamber), and/or increased chamber temperature may result in deposition rate variation and thus poor film thickness uniformity after the initial substrate is processed. As can be seen in FIG. 3, which illustrates a graph showing the film deposition rate (in Å/min) and film uniformity rate (in %) for a PECVD-deposited SiN film vary inconsistently as a function of the number of the substrates being processed. The thickness and the electrical properties of the film can vary across the diameter of each substrate and can also vary from substrate to substrate. It has been reported that this non-uniformity is even more severe for larger substrates of size measuring approximately about 3 meter by 3 meter in scale. Non-uniformity of the deposited layers limits yield and productivity of the deposition process, as well as overall performance of the integrated circuits.

While a frequent chamber cleaning (e.g., every 1-2 substrates) may be performed to stabilize the chamber conditions and thus improve the film thickness uniformity, the frequent chamber cleaning would reduce the overall throughput of the production line. Therefore, there is a need for depositing a silicon nitride material on large-sized substrates with better film uniformity and reliable repeatability while maintaining the substrate throughput.

SUMMARY OF THE INVENTION

Embodiments of the present invention provide methods for depositing a nitrogen-containing material on large-sized substrates disposed in a processing chamber. In one embodiment, a method includes processing a batch of substrates within a processing chamber to deposit a nitrogen-containing material on a substrate from the batch of substrates, and performing a seasoning process at predetermined intervals during processing the batch of substrates to deposit a conductive seasoning layer over a surface of a chamber component disposed in the processing chamber. The chamber component may include a gas distribution plate fabricated from a bare aluminum without anodizing. In one example, the conductive seasoning layer may include amorphous silicon, doped amorphous silicon, doped silicon, doped polysilicon, doped silicon carbide, or the like.

In another embodiment, the method for depositing a silicon nitride material on a substrate placed in a processing chamber includes seasoning a surface of a chamber component disposed in a processing region of the processing chamber by depositing a silicon nitride seasoning layer over the surface of the chamber component, and processing a substrate from a batch of substrates within the processing chamber using a plasma enhanced CVD (PECVD) technique, comprising depositing a nitrogen-containing material on $1^{st}$ substrate to $N^{th}$ substrate by introducing a nitrogen-containing gas and a silicon-containing gas into the processing chamber, seasoning the surface of the chamber component disposed in the processing region of the processing chamber at predetermined intervals by depositing a conductive layer over the surface of the chamber component, and depositing a nitrogen-containing material on $N+1^{th}$ to $N+N^{th}$ substrate by introducing a nitrogen-containing gas and a silicon-containing gas into the processing chamber. The chamber component generally includes a gas distribution plate that is fabricated from a bare aluminum without anodizing. In one example, the conductive seasoning layer may include amorphous silicon, doped amorphous silicon, doped silicon, doped polysilicon, doped silicon carbide, or the like. The batch deposition of the nitrogen-containing material may be performed at an RF power ranging between about 200 W and about 27000 W.

In yet another embodiment, the method for depositing a nitrogen-containing material on a substrate in a processing chamber includes performing a first seasoning process to deposit a first seasoning layer over a surface of a chamber component disposed in the processing chamber, processing a batch of substrates within a processing chamber to deposit a nitrogen-containing material on a substrate from the batch of substrates, and performing a second seasoning process at predetermined intervals during processing the batch of substrates to deposit a conductive seasoning layer over the surface of the chamber component disposed in the processing chamber. In one example, the conductive seasoning layer may include amorphous silicon, doped amorphous silicon, doped silicon, doped polysilicon, doped silicon carbide, or the like.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to an amorphous silicon (a-Si) seasoning process for silicon nitride film deposited on large-sized substrates in a batch process using a plasma enhanced chemical vapor deposition (PECVD) system. The a-Si seasoning process may be performed periodically or at any desired intervals such as every 3 or 5 substrates during batch processing of SiN depositions to improve run-to-run uniformity of the SiN layer thickness without significantly affecting the overall throughput. It has been discovered that the periodic a-Si seasoning process performed during batch depositing of SiN films can also extend the throughput limit of the deposition process to at least about 15 to about 40 substrates in a row before a standard full chamber cleaning process is necessary.

Exemplary Hardware Overview

Figure 1:
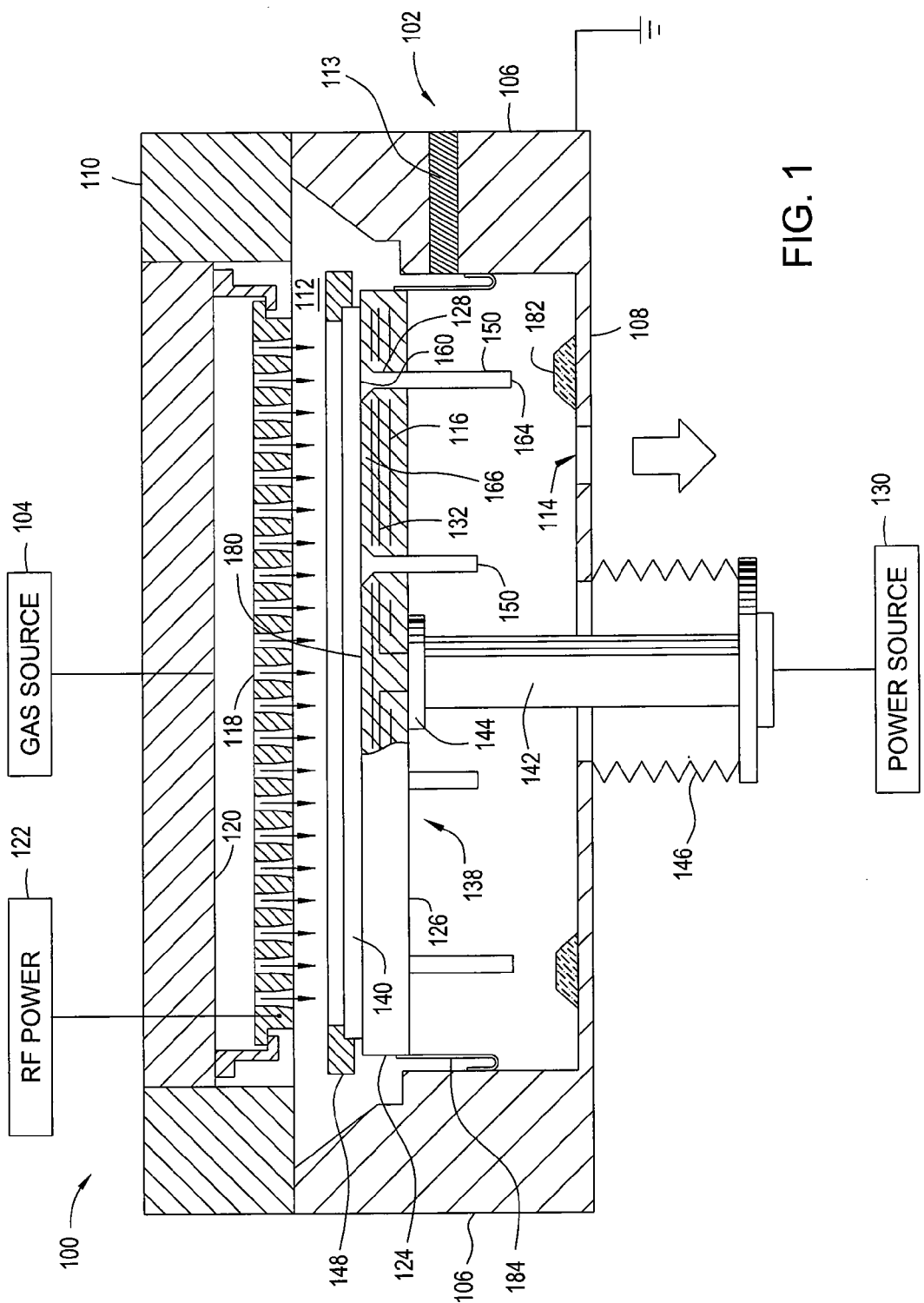
FIG. 1 schematically illustrates a cross-sectional view of a plasma enhanced chemical vapor deposition (PECVD) chamber having one embodiment of a substrate support.

FIG. 1 schematically illustrates a cross-sectional view of a plasma enhanced chemical vapor deposition system 100 that may be used for practicing the present invention. The plasma enhanced chemical vapor deposition system 100 is configured to process a large area substrate 140 (hereafter substrate 140) using plasma in forming structures and devices on the substrate 140 for use in the fabrication of liquid crystal displays (LCD's), flat panel displays, organic light emitting diodes (OLED's), or photovoltaic cells for solar cell arrays. One example of such a system is an AKT 90K PECVD system, suitable for substrate size 3000 mm×3000 mm or larger size substrates, which is commercially available from Applied Materials, Inc., of Santa Clara, Calif.

The system 100 generally includes a chamber 102 coupled to a gas source 104. The chamber 102 comprises chamber walls 106, a chamber bottom 108 and a lid assembly 110 that define a process volume 112. The process volume 112 is typically accessed through a port 113 formed in the chamber walls 106 that facilitates passage of the substrate 140 into and out of the chamber 102. The chamber walls 106 and chamber bottom 108 may be fabricated from a unitary block of aluminum or other material compatible for plasma processing. The chamber walls 106 and chamber bottom 108 may be electrically grounded. The chamber bottom 108 has an exhaust port 114 that is coupled to various pumping components (not shown) to facilitate control of pressure within the process volume 112 and exhaust gases and byproducts during processing.

The substrate 140 may be thin sheet of metal, plastic, organic material, silicon, glass, quartz, or polymer, among others suitable materials. The substrate 140 may have a surface area greater than about 1 square meter, such as greater than about 2 square meters. As will be discussed later, the present invention is particularly useful for deposition of silicon nitride film on large-sized substrates having a plan surface area of about 15,600 cm$^2$, or greater, for example about a 90,000 cm$^2$ plan surface area (or greater). The plasma processing system 100 may be configured to deposit a variety of materials on the substrates 140, including but not limited to dielectric materials (e.g., SiO$_2$, SiO$_x$N$_y$, derivatives thereof or combinations thereof), semiconductive materials (e.g., Si and dopants thereof), barrier materials (e.g., SiN$_x$, SiO$_x$N$_y$, or derivatives thereof). Specific examples of dielectric materials and semiconductive materials that are formed or deposited by the plasma processing system 100 onto the large area substrates may include, but is not limited to epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The plasma processing system 100 is also configured to receive gases such as argon, hydrogen, nitrogen, helium, or combinations thereof, for use as a purge gas or a carrier gas (e.g., Ar, H$_2$, N$_2$, He, derivatives thereof, or combinations thereof).

In the embodiment depicted in FIG. 1, the chamber 102 has a gas source 104, and a power source 122 coupled thereto. The power source 122 is coupled to a gas distribution plate 118 to provide an electrical bias that energizes the process gas and sustains a plasma formed from process gas in the process volume 112 below the gas distribution plate 118 during processing.

The lid assembly 110 is supported by the chamber walls 106 and can be removed to service the chamber 102. The lid assembly 110 is generally comprised of aluminum. The gas distribution plate 118 is coupled to an interior side 120 of the lid assembly 110. The gas distribution plate 118 may be fabricated from aluminum. In one particular embodiment, the gas distribution plate 118 is fabricated from a bare aluminum without anodizing. The center section of the gas distribution plate 118 includes a perforated area through which process gases and other gases supplied from the gas source 104 are delivered to the process volume 112.

A substrate support assembly 138 is centrally disposed within the chamber 102 to support the substrate 140 during processing. The substrate support assembly 138 generally comprises an electrically conductive body 124 supported by a shaft 142 that extends through the chamber bottom 108. The support assembly 138 may be grounded such that RF power supplied by the power source 122 to the gas distribution plate 118 may excite the gases disposed in the process volume 112 between the support assembly 138 and the gas distribution plate 118. The conductive body 124 may be grounded through one or more RF ground return path members 184 coupled between a perimeter of the conductive body 124 and the grounded chamber bottom 108.

In one embodiment, at least the portion of the conductive body 124 may be covered with an electrically insulative coating to improve deposition uniformity without expensive aging or plasma treatment of the support assembly 138. The conductive body 124 may be fabricated from metals or other comparably electrically conductive materials. The coating may be a dielectric material such as oxides, silicon nitride, silicon dioxide, aluminum dioxide, tantalum pentoxide, silicon carbide, polyimide, among others. Alternatively, a top surface 180 of the conductive body 124 may be free of coating or anodizing.

In one embodiment, the conductive body 124 encapsulates at least one embedded heating element 132. At least a first reinforcing member 116 is generally embedded in the conductive body 124 proximate the heating element 132. A second reinforcing member 166 may be disposed within the conductive body 124 on the side of the heating element 132 opposite the first reinforcing member 116. The reinforcing members 116 and 166 may be comprised of metal, ceramic or other stiffening materials. Generally, the reinforcing members 116 and 166 have some porosity that allows aluminum to impregnate the members 116, 166 during a casting process described below. The heating element 132, such as an electrode disposed in the support assembly 138, is coupled to a power source 130 and controllably heats the support assembly 138 and the substrate 140 positioned thereon to a desired temperature.

Figure 2:
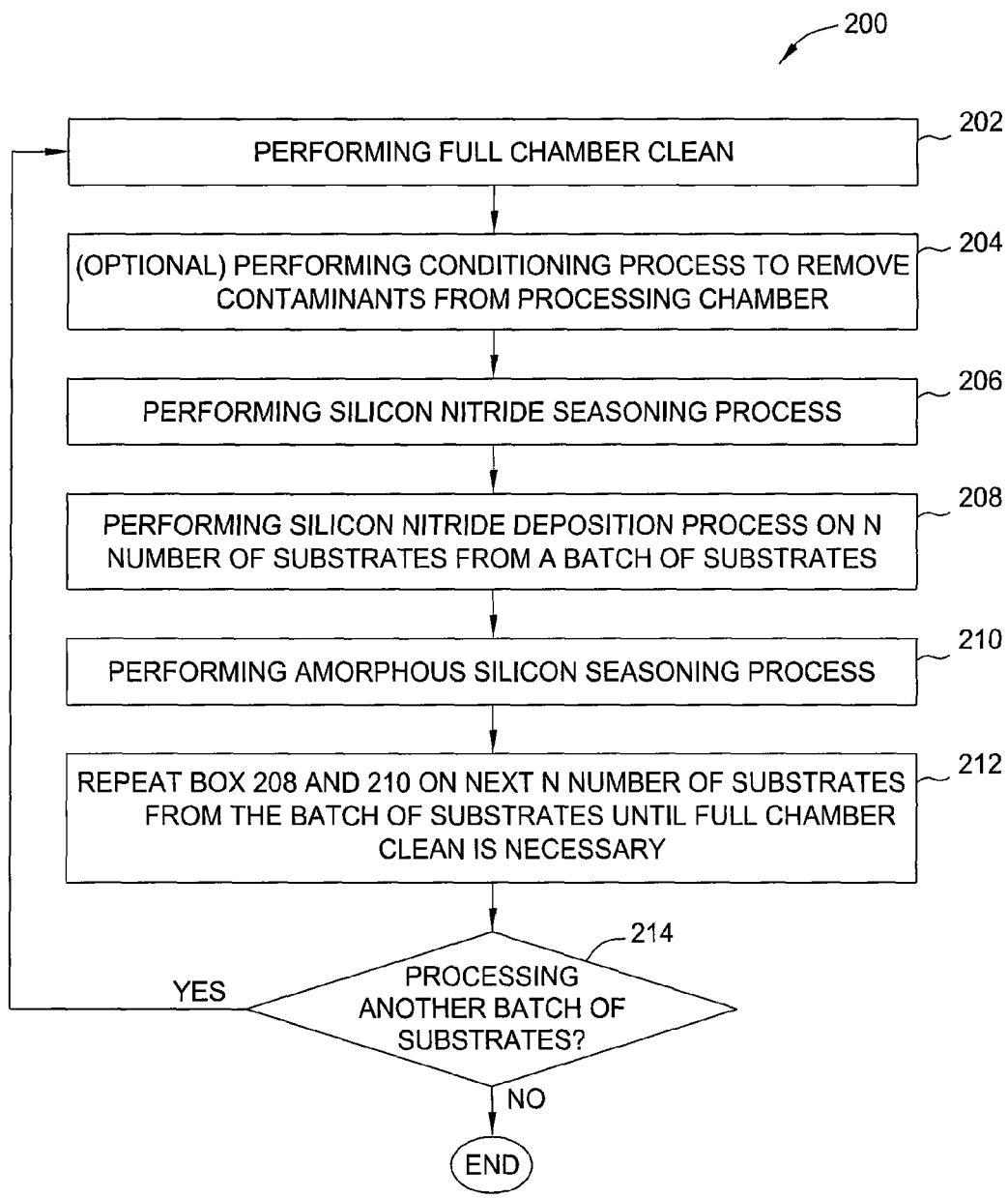
FIG. 2 illustrates a process sequence that can be performed in a PECVD processing chamber of FIG. 1 for processing a batch of substrates to deposit a nitrogen-containing material on a substrate.
Figure 3:
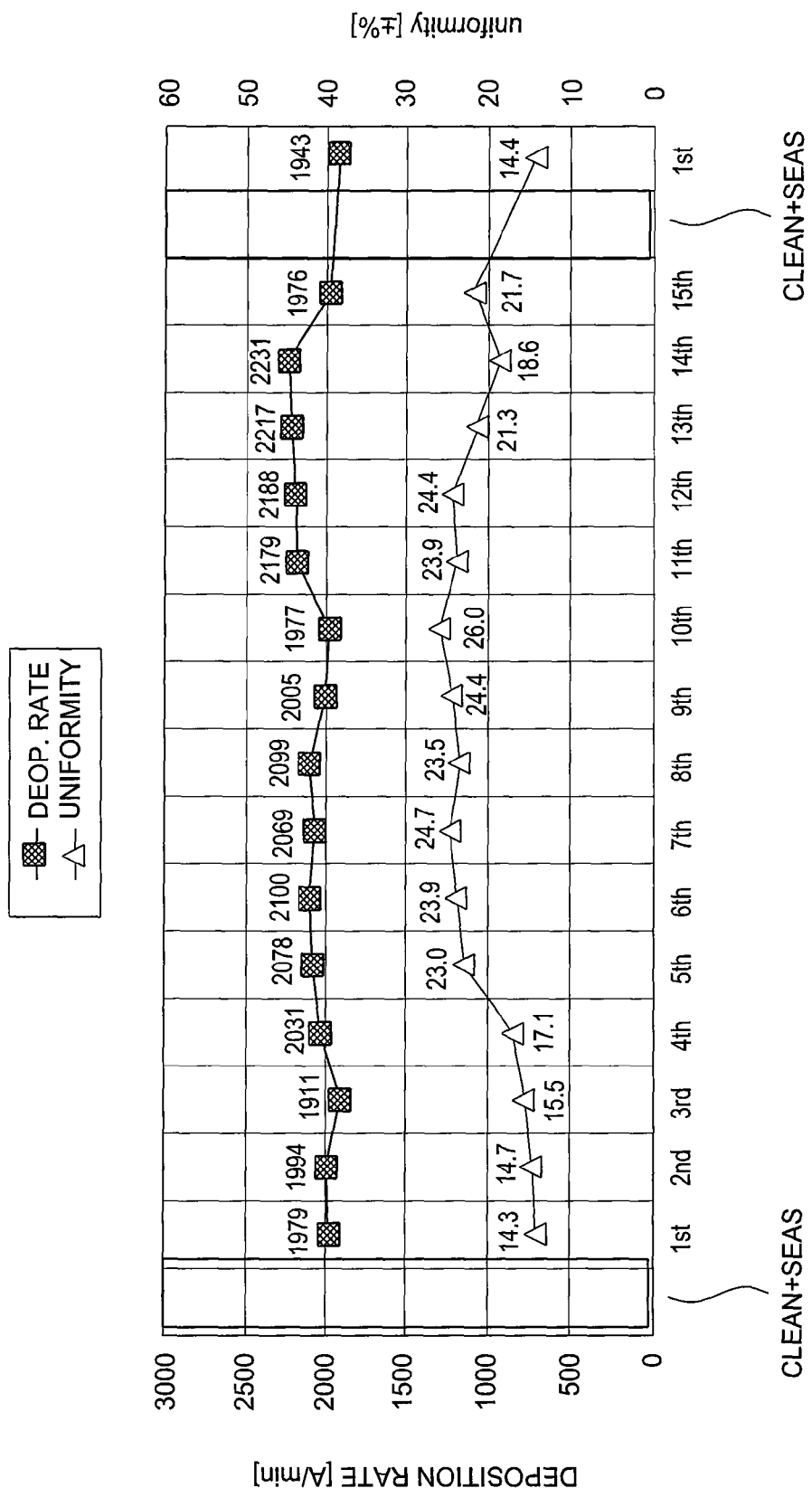
FIG. 3 illustrates a graph showing the film deposition rate (in Å/min) and film uniformity rate (in %) for a PECVD-deposited SiN film vary inconsistently as a function of the number of the substrates being processed.

The conductive body 124 has a lower side 126 opposite the top surface 180. The top surface 180 is configured to support the substrate 140 and heat to the substrate 140. The top surface 180 may be roughened (as shown in FIG. 2) to formed spaces between the top surface 180 and the substrate 140. The roughened top surface 180 reduces capacitive coupling between the conductive body 124 and the substrate 140. The lower side 126 has a stem cover 144 coupled thereto to provide a mounting surface for the attachment of the shaft 142 thereto.

The shaft 142 extends from the stem cover 144 and couples the support assembly 138 to a lift system (not shown) that moves the support assembly 138 between an elevated position (as shown) and a lowered position. A bellows 146 provides a vacuum seal between the process volume 112 and the atmosphere outside the chamber 102 while facilitating the movement of the support assembly 138. The support assembly 138 additionally supports a circumscribing shadow frame 148. Generally, the shadow frame 148 prevents deposition at the edge of the substrate 140 and support assembly 138 so that the substrate does not stick to the support assembly 138.

The support assembly 138 has a plurality of holes 128 formed therethrough that accept a plurality of lift pins 150. The lift pins 150 are typically comprised of ceramic or anodized aluminum. Generally, the lift pins 150 have first ends 160 that are substantially flush with or slightly recessed from a top surface 180 of the support assembly 138 when the lift pins 150 are in a normal position (i.e., retracted relative to the support assembly 138). The first ends 160 are generally flared or otherwise enlarged to prevent the lift pins 150 from falling through the holes 128. Additionally, the lift pins 150 have a second end 164 that extends beyond the lower side 126 of the support assembly 138. The lift pins 150 come in contact with the chamber bottom 108 and are displaced from the top surface 180 of the support assembly 138, thereby placing the substrate 140 in a spaced-apart relation to the support assembly 138.

Lift pins 150 of varying lengths may be utilized so that they come into contact with the bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. Alternatively, lift pins 150 of a uniform length may be utilized in cooperation with bumps or plateaus 182 positioned beneath the outer lift pins 150, so that the outer lift pins 150 are actuated before and displace the substrate 140 a greater distance from the top surface 180 than the inner lift pins 150.

Exemplary a-Si Seasoning Process

FIG. 2 illustrates a process sequence 200 that can be performed in a PECVD processing chamber as discussed above in conjunction with FIG. 1. Specifically, the process sequence 200 may be used for processing a batch of large-sized substrates within the PECVD processing chamber to deposit a nitrogen-containing material such as $SiN_x$ on the substrate. The batch of substrates may include a desired number of substrates, such as about 10 to about 30 substrates, for example, about 15 substrates. It should be noted that the configuration, number of processing steps, and order of the processing steps in the process sequence 200 is not intended to be limiting to the scope of the invention described herein, since one or more steps can be added, deleted and/or reordered without deviating from the basic scope of the invention described herein.

At box 202, an optional standard full chamber cleaning process may be performed to remove material(s) previously deposited on the chamber walls or surfaces of the components. In an exemplary deposition cycle, this standard full chamber cleaning process may be performed periodically (e.g., every 15 substrates) or at any desired interval. The standard full chamber cleaning process may be performed for about 5 seconds to about 300 seconds, depending upon the number of substrates processed in the chamber between each cleaning.

The standard full chamber cleaning process may include an in-situ dry cleaning process or a remote plasma source cleaning. In an in-situ dry cleaning process, one or more gases are dissociated within the processing chamber to form one or more reactive gas species (e.g., fluorine ions, radicals). The reactive species clean chamber surfaces by forming volatile compounds with the material accumulated on those surfaces. In a remote plasma source cleaning, as used in this embodiment, cleaning gas(es) are dissociated in a separate chamber (not shown) to form one or more reactive species (e.g., fluorine radicals) which then flowed downstream into the processing chamber 102 to assist in chamber cleaning or plasma initiation/stabilization within the chamber 102 if an RF plasma is employed during chamber cleaning.

The cleaning gas used in the cleaning process may generally include, but not limited to $NF_3$, $F_2$, $CF_4$, $SF_6$, $C_2F_6$, $CCl_4$, $C_2Cl_6$, $H_2$, $H_2O$, a halogen and/or a halogen containing compound, or the combination thereof. Optionally, the cleaning gas may further include inert gas, such as helium or argon. An oxygen-containing gas such as $O_2$ may be introduced into the chamber along with the cleaning gas thereby more rapidly heating the chamber to further improve the effectiveness of the process. In cases where an $NF_3$ precursor gas is used, the cleaning process may be performed by introducing $NF_3$ precursor into the processing chamber 102 gas at a flow rate between about 2000 sccm and about 20000 sccm and at a chamber pressure of about 0.1 Torr to about 20 Torr. A microwave power of about 200 W to about 400 W, for example about 300 W, is supplied to the remote plasma chamber to activate the $NF_3$ precursor gas.

At box 204, an optional conditioning process may be performed to remove undesirable fluorine (F) or nitrogen (N) containing contaminants from the cleaning process that are bonded to, or adsorbed on, the chamber surfaces. In one embodiment, a hydrogen containing plasma is formed in the processing chamber 102 by flowing 1200 sccm of hydrogen into the processing chamber 102 for 30 seconds, creating a plasma using 300 Watts of power. The hydrogen plasma reacted with the fluorine present in the processing chamber 102, thereby forming a volatile HF containing vapor that is readily removable via the chamber exhaust port 114. The processing chamber 102 is typically maintained at the temperature to be used for subsequent deposition, and a pressure of about 1.2 Torr. The spacing between the substrate support assembly 138 and the gas distribution plate 118 is about 1500 mils.

At box 206, a silicon nitride seasoning process is performed to deposit a protective layer of silicon nitride on the walls of the cleaned processing chamber 102. Optionally, a precursor layer of silicon oxide ($SiO_2$) may be first deposited on the walls of the processing chamber 102 prior to the silicon nitride seasoning process. Depositing a precursor layer may be advantageous since the subsequent SiN seasoning layer adheres more uniformly to the underlying precursor layer than directly to the chamber components. Thus, the SiN seasoning layer is less likely to chip and become fragmented when deposited over a precursor layer rather than directly over the chamber components, thereby improving contamination control. The SiN seasoning process may be carried out with no substrate in the processing chamber 102. Alternatively, a sacrificial (dummy) substrate may be placed in the processing chamber 102 during the silicon nitride seasoning process.

During the silicon nitride seasoning process, the flow of $N_2$ may be introduced into the processing chamber 102 for about 10 seconds. Then the in-situ plasma source is activated and the flows of $SiH_4$ and $NH_3$ are begun. These flows of $N_2$, $NH_3$, and $SiH_4$ are maintained for about 20 seconds whereupon the flows of $N_2$, $NH_3$, and $SiH_4$ are stopped, and then the in-situ plasma source is deactivated and the chamber is evacuated. In one embodiment where a substrate having a plan surface area of about 90,000 $cm^2$ is used, the seasoning layer of silicon nitride is deposited by flowing about 5000 sccm of $SiH_4$, about 26000 sccm of $NH_3$, and about 80000 sccm of $N_2$ into the processing chamber 102. The processing chamber 102 is maintained at a temperature of about 250° C. to about 400° C., such as about 350° C., and a pressure of about 1.3 Torr. The RF power supplied to the processing chamber 102 is about 27000 W. The spacing between the substrate support assembly 138 and the gas distribution plate 118 is about 750 mils. The silicon nitride seasoning layer may be deposited to a thickness of between about 10 Å to about 5000 Å. In one embodiment, the silicon nitride seasoning layer may be deposited to a thickness between about 500 Å and about 6000 Å.

One advantage obtained by seasoning the processing chamber 102 with a silicon nitride layer is that the SiN seasoning layer may act as a glue layer in that the subsequently deposited nitrogen-containing materials tend to adhere thereto better than to the internal chamber surface. As such, residual silicon nitride materials are less likely to become dislodged during substrate processing. Furthermore, any remaining particles in the processing chamber 102 from the previous chamber cleaning process or the optional conditioning process are encapsulated and sealed so that the particles cannot fall onto the substrate to be processed.

At box 208, a series of nitrogen-containing material (e.g., SiN) depositions are performed on N number of substrates (where N is a desired integral number of substrates) before an a-Si seasoning process at box 210 is carried out. In one embodiment, the N ranges between 3 and 12, such as 5 substrates. In such a case, the SiN deposition is performed successively from the first substrate to the fifth substrate. The nitrogen-containing material for fabricating the silicon nitride film on the substrate 140 is obtained from a nitrogen-containing gas. A suitable nitrogen-containing gas may be $N_2$, $NH_3$, $N_2H_4$, or the like. In one embodiment where a substrate having a plan surface area of about 90,000 $cm^2$ is used, a nitrogen-containing gas comprising $NH_3$ is introduced into the processing chamber 102 at a flow rate of from about 2000 sccm to about 36000 sccm, for example about 26000 sccm. The substrate 140 in the processing chamber 102 may be heated to a predefined temperature of about 450° C. to about 680° C., such as about 600° C. It is believed that the higher temperatures increase the surface energy of the substrate 140 to provide better surface reactivity of any adsorbed species. The pressure in the processing chamber 102 is from about 100 mTorr to about 150 Torr, for example 1.3 Torr. A portion of the $NH_3$ gas is chemically adsorbed onto the heated substrate surfaces when the $NH_3$ gas introduced into the chamber. The remaining $NH_3$ gas is then pumped out of the processing chamber 102 for less than about 5 seconds to remove the residual $NH_3$ gas not already absorbed by the substrate 140.

After the nitrogen gas introducing step, the flow of the $NH_3$ gas is stopped and the processing chamber 102 is pumped down to remove the residual $NH_3$ gas not already adsorbed by the substrate 140. The step of removing the remaining $NH_3$ gas may be performed for about two seconds. If desired, the processing chamber 102 may be purged with an inert gas such as Ar or $N_2$ gas, and the purge step also takes less than about 2 seconds.

After the aforementioned steps are completed, a silicon-containing gas is provided into processing chamber 102 to react with the adsorbed $NH_3$ gas on the surface of substrate 140 to form a silicon nitride film. In one embodiment where a substrate having a plan surface area of about 90,000 $cm^2$ is used, the silicon-containing gas is $SiH_4$ at a flow rate of from about 2000 sccm to about 8000 sccm, such as about 5000 sccm. The pressure in the processing chamber 102 is maintained at about 1.5 Torr. The pump system (not shown) then exhausts the $SiH_4$ gas from the processing chamber 102 via the exhaust port 114. The $SiH_4$ gas is introduced into the processing chamber 102 for typically less than about 360 seconds. The SiN may be deposited utilizing either a single frequency RF bias to the gas distribution plate 118 or a dual frequency bias where both the gas distribution plate 118 and the substrate support assembly 138 are biased. In one embodiment, the RF power supplied to the processing chamber 102 during the SiN deposition is between about 200 W and about 27000 W at a frequency ranging between about 0.3 MHz and about 200 MHz, such as 13.56 MHz. The spacing between the substrate support assembly 138 and the gas distribution plate 118 is between about 200 mils and about 900 mils, for example about 750 mils.

Thereafter, the flow of $SiH_4$ gas is stopped and the processing chamber 102 is pumped down to remove residual $SiH_4$ gas that has not reacted with the adsorbed $NH_3$ gas on surface of the substrate 140. The step of removing the remaining $NH_3$ gas may be performed for about two seconds. If desired, the processing chamber 102 may be purged with an inert gas in a same manner as discussed previously. A silicon nitride film is therefore formed on the surface of the substrate 140. It is contemplated that the process as described here may be repeated for a plurality of cycles until the desired thickness of the silicon nitride film is obtained. The thickness of the silicon nitride film formed on the substrate 140 may vary depending upon the process regime.

At box 210, an amorphous silicon (a-Si) seasoning process is performed to deposit a seasoning layer onto the surface(s) of the processing chamber components. In one embodiment, the processing chamber components comprise a gas distribution plate 118 that is fabricated from a bare aluminum without anodizing. The a-Si seasoning process may be performed at any intervals during batch processing of SiN depositions without significantly affecting the throughput. In one embodiment, the frequency of the a-Si seasoning process is once about every 3 to 6 substrates, such as about every 5 substrates. In that case, if the SiN deposition at box 208 were continuously performed on five substrates (i.e., the first substrate to the fifth substrate), the a-Si seasoning process is conducted after the fifth substrate deposition is done. It is appreciated that the frequency of the a-Si seasoning process as discussed here may vary depending upon the number of substrates processed at box 208.

The a-Si seasoning layer may act as a shield over any residual deposited material that is disposed on the various process chamber components. It has been also observed that the inventive a-Si seasoning process helps to maintain the deposition rate and thickness uniformity of silicon nitride film on large-sized substrates in a batch process using a PECVD system. While the mechanism behind this phenomenon is not yet fully understood, it is believed the a-Si seasoning process may change or moderate the surface conductivity of the gas distribution plate that is fabricated from a bare aluminum which may negatively affect the thickness uniformity of the silicon nitride films, which is also conductive, during the deposition. Therefore, in certain embodiments the a-Si seasoning layer may be replaced with other conductive material such as doped a-Si, doped silicon, doped polysilicon, doped silicon carbide, or the like.

In one embodiment where a substrate having a plan surface area of about 90,000 cm$^2$ is used, the a-Si seasoning process may be performed for about 10 seconds to about 400 seconds, such as between about 150 seconds and 210 seconds. The a-Si seasoning layer may be deposited by flowing an appropriate gas such as silane through the processing chamber 102 and generating a plasma to deposit the layer of amorphous silicon on the surfaces of the processing chamber components. In one example, the seasoning layer is deposited by providing a gas mixture of hydrogen gas to silane gas in a ratio of about 1:20 or less at a chamber pressure between about 0.1 Torr and about 20 Torr. Silane gas may be provided at a flow rate between about 3000 sccm/L and about 6000 sccm/L, such as about 5000 sccm/L, and the hydrogen gas may be provided at a flow rate between about 60 sccm/L and about 150 sccm/L, such as about 100 sccm/L. An RF power of between 15 milliWatts/cm$^2$ and about 250 milliWatts/cm$^2$ may be provided to the gas distribution plate 118. The thickness of the a-Si seasoning layer may be greater than about 200 Å. In one example, the a-Si seasoning layer thickness is greater than about 500 Å. In another example, the seasoning layer thickness is between about 500 Å and about 1500 Å.

At box 212, after completion of the a-Si seasoning process at box 210, a series of nitrogen-containing material (e.g., SiN) depositions, similar to the SiN deposition process at box 208, are continued to perform on next N number of substrates (where N is a desired number of substrates, such as 5), followed by the a-Si seasoning process similar to those performed at box 210. Depending upon the film repeatability and chamber conditions, the processes as described at boxes 208 and 210 may be repeated as many times as desired until a standard full chamber cleaning process becomes necessary.

At box 214, after completion of the nitrogen-containing material deposition process or after processing a predefined number of substrates in a batch processing cycle, the process 200 may proceed to an end, or start again from box 202 to 212 to process another batch of substrates.

It has been discovered that the inventive a-Si seasoning process performed during batch PECVD processing of SiN films on large-sized substrates enables extension of the throughput limit of the deposition process to at least about 15 substrates to about 40 substrates in a row before a standard full chamber cleaning process is necessary. The a-Si seasoning process performed periodically or at any desired intervals such as every 3 or 5 substrates during batch processing of SiN depositions also improves run-to-run uniformity of the SiN layer thickness while maintaining the consistent deposition rate.

While the foregoing is directed to embodiments of the present invention, other and further embodiments of the invention may be devised without departing from the basic scope thereof, and the scope thereof is determined by the claims that follow.

What is claimed is:

1. A method for depositing a nitrogen-containing material on a substrate, comprising:
    performing a first chamber seasoning process by depositing a silicon nitride seasoning layer over a surface of a chamber component in a processing chamber without the substrate being present;
    after the first chamber seasoning process, processing a first substrate within the processing chamber to deposit a nitrogen-containing material layer on the first substrate;
    after the deposition of the nitrogen-containing material layer on the first substrate, performing a second chamber seasoning process without the substrate being present to deposit a conductive seasoning layer over the surface of the chamber component in the processing chamber;
    after the second chamber seasoning process, processing a second substrate within the processing chamber to deposit a nitrogen-containing material layer on the second substrate; and
    after the deposition of the nitrogen-containing material layer on the second substrate, performing a third chamber seasoning process to deposit a silicon nitride seasoning layer over the surface of the chamber component in the processing chamber without the substrate being present.

2. The method of claim 1, wherein the nitrogen-containing material comprises silicon nitride material.

3. The method of claim 1, wherein the conductive seasoning layer comprises amorphous silicon, doped amorphous silicon, doped silicon, doped polysilicon, or doped silicon carbide.

4. The method of claim 1, wherein the substrate has a surface area of about 90,000 cm$^2$ or greater.

5. The method of claim 1, wherein the chamber component comprising a gas distribution plate fabricated from a bare aluminum without anodizing.

6. The method of claim 1, further comprising:
    after processing the first substrate and before the second chamber seasoning process, performing a chamber cleaning process using an in-situ dry cleaning process or a remote plasma cleaning process.

7. A method for depositing a nitrogen-containing material on a substrate placed in a processing chamber, comprising:
    seasoning a surface of a chamber component in a processing region of the processing chamber by depositing a silicon nitride seasoning layer over the surface of the chamber component without the substrate being present;
    after seasoning the surface of the chamber component, processing a batch of substrates within the processing chamber using a plasma enhanced CVD (PECVD) technique, comprising:
        depositing a nitrogen-containing material on $1^{st}$ substrate to $N^{th}$ substrate by introducing a nitrogen-containing gas and a silicon-containing gas into the processing chamber;
        seasoning the surface of the chamber component in the processing region of the processing chamber by depositing an amorphous silicon seasoning layer over the surface of the chamber component without the substrate being present; and
        after seasoning the surface of the chamber component, depositing a nitrogen-containing material on $N+1^{th}$ to $N+N^{th}$ substrate by introducing a nitrogen-containing gas and a silicon-containing gas into the processing chamber; and
    after the last substrate of the batch of substrates is deposited with the nitrogen-containing material, processing seasoning the surface of the chamber component in the processing region of the processing chamber by depositing a silicon nitride seasoning layer over the surface of the chamber component without the substrate being present.

8. The method of claim 7, wherein the nitrogen-containing material comprises silicon nitride material.

9. The method of claim 7, wherein the deposition of the amorphous silicon seasoning layer is performed after about every 3 substrates to about 6 substrates are done with the deposition of the nitrogen-containing material.

10. The method of claim 7, further comprising:
    after processing the batch of substrates, performing a chamber cleaning process using an in-situ dry cleaning process or a remote plasma cleaning process.

11. The method of claim 7, wherein the chamber component comprises a gas distribution plate fabricated from a bare aluminum without anodizing.

12. The method of claim 7, wherein the substrate has a surface area of about 90,000 cm$^2$ or greater.

13. The method of claim 7, wherein the N is an integral number ranging between about 3 to about 12.

14. A method for depositing a nitrogen-containing material on a substrate in a processing chamber, comprising:
    performing a first seasoning process to deposit a first seasoning layer comprising silicon nitride over a surface of a chamber component in the processing chamber without the substrate being present;
    after the first seasoning process, processing a first batch of substrates within the processing chamber to deposit a nitrogen-containing material layer on a substrate from the first batch of substrates;
    after a desired number of substrates have been deposited with the nitrogen-containing material layer, performing a second seasoning process to deposit a second seasoning layer comprising amorphous silicon over the surface of the chamber component in the processing chamber without the substrate being present;
    after the second seasoning process, processing a second batch of substrates within the processing chamber to deposit a nitrogen-containing material layer on a substrate from the second batch of the substrates and after the deposition of the nitrogen-containing material layer on the substrate from the second batch of substrates, performing a third seasoning process to deposit a silicon nitride seasoning layer over the surface of the chamber component in the processing chamber without the substrate being present.

15. The method of claim 14, wherein the chamber component comprises a gas distribution plate fabricated from a bare aluminum without anodizing.

16. A method for depositing a nitrogen-containing material on a substrate placed in a processing chamber, comprising:
    performing a first chamber seasoning process by depositing a silicon nitride seasoning layer over a surface of a chamber component in a processing region of the processing chamber without the substrate being present;
    after the first chamber seasoning process, processing a batch of substrates within the processing chamber, comprising:
        depositing a nitrogen-containing material layer on $1^{st}$ substrate to $N^{th}$ substrate;
        performing a second chamber seasoning process by depositing a conductive seasoning layer over the surface of the chamber component without the substrate being present; and
        after the second chamber seasoning process, depositing a nitrogen-containing material layer on $N+1^{th}$ to $N+N^{th}$ substrate; and
    after the last substrate of the batch of substrates is done with the nitrogen-containing material layer and has been removed from the processing chamber, performing a third chamber seasoning process without the substrate being present to deposit a silicon nitride seasoning layer over the surface of the chamber component in the processing chamber.

17. The method of claim 16, further comprising:
before the third chamber seasoning process, performing a chamber cleaning process using an in-situ dry cleaning process or a remote plasma cleaning process.

* * * * *